United States Patent [19]
Sinta et al.

[11] Patent Number: 5,976,770
[45] Date of Patent: Nov. 2, 1999

[54] DYED PHOTORESISTS AND METHODS AND ARTICLES OF MANUFACTURE COMPRISING SAME

[75] Inventors: Roger F. Sinta, Woburn; Thomas M. Zydowsky, Cambridge, both of Mass.

[73] Assignee: Shipley Company, L.L.C., Marlborough, Mass.

[21] Appl. No.: 09/007,623

[22] Filed: Jan. 15, 1998

[51] Int. Cl.$^6$ ....................................... G03C 5/00
[52] U.S. Cl. ................. 430/325; 430/270.1; 430/926
[58] Field of Search ................. 430/325, 270.1, 430/926

[56] References Cited

U.S. PATENT DOCUMENTS

| | | | |
|---|---|---|---|
| 4,551,409 | 11/1985 | Gulla et al. | 430/192 |
| 5,055,439 | 10/1991 | Allen et al. | 502/158 |
| 5,059,512 | 10/1991 | Babich et al. | 430/280 |
| 5,272,042 | 12/1993 | Allen et al. | 430/270 |
| 5,296,332 | 3/1994 | Sachdev et al. | 430/270 |
| 5,498,748 | 3/1996 | Urano et al. | 560/67 |
| 5,731,125 | 3/1998 | Yamachika et al. | 430/270.1 |
| 5,851,730 | 12/1998 | Thackeray et al. | 430/271.1 |
| 5,851,738 | 12/1998 | Thackeray et al. | 430/327 |

FOREIGN PATENT DOCUMENTS

| | | |
|---|---|---|
| 0 726 500 A1 | 8/1996 | European Pat. Off. . |
| 0 834 770 A2 | 4/1998 | European Pat. Off. . |

*Primary Examiner*—Janet Baxter
*Assistant Examiner*—Rosemary Ashton
*Attorney, Agent, or Firm*—Darryl P. Frickey; Peter F. Corless

[57] ABSTRACT

The present invention provides new photoresist compositions that comprise a resin binder, a photoactive component, particularly an acid generator, and a low molecular weight anthracene dye compounds. It has been found that these dye compounds can significantly reduce or even eliminate undesired reflections of exposure radiation, particularly deep U.V. exposure radiation such as 248 nm, as well as function as effective sensitizer compounds, enabling effective imaging at higher wavelengths, particularly I-line exposures.

28 Claims, No Drawings

DYED PHOTORESISTS AND METHODS AND ARTICLES OF MANUFACTURE COMPRISING SAME

BACKGROUND OF THE INVENTION

1. Field of the Invention

This invention relates to new photoresist compositions especially for deep U.V. (particularly 248 nm) and I-line (365 nm) exposures and having the capability of forming highly resolved features.

2. Background Art

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

An important property of a photoresist is image resolution. A developed photoresist image of fine line definition, including lines of sub-micron and sub-half micron dimensions and having vertical or essentially vertical sidewalls is highly desirable to permit accurate transfer of circuit patterns to an underlying substrate. However, many current photoresists are not capable of providing such highly resolved fine line images.

For example, reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength) including excimer laser light (ca. 248 nm) and ArF excimer laser light (193 nm). The use of shortened wavelengths of light for imaging a photoresist coating has resulted in greater penetration of the photoresist layer and increased reflection of the exposing energy back into the photoresist layer. Thus, the use of the shorter wavelengths has exacerbated the problems of reflection from a substrate surface.

Many existing exposure tools are designed for imaging with relatively longer wavelengths, e.g. I-line (ca. 365 nm) wavelengths. However, advanced resists designed for imaging at shorter wavelengths such as 248 nm often can not be effectively exposed with an I-line exposure because the resist's photoactive component is not activated at 365 nm or other higher wavelengths. This requires design and supply of additional resist compositions that can be effectively imaged at selected wavelengths.

It thus would be desirable to have new photoresist compositions that could provide highly resolved fine line images, including images of sub-micron and sub-half micron dimensions. It would be further desirable to have such new photoresist compositions that could be imaged with deep U.V. radiation as well as other wavelengths, particularly 365 nm. It would be particularly desirable to have such photoresists that reduce undesired reflections of exposure radiation.

SUMMARY OF THE INVENTION

The present invention provides new photoresist compositions that in general comprise a resin binder, a photoactive component, particularly a photoacid generator compound, and a relatively low molecular weight dye material that contains an anthracene group.

We have surprisingly found that the dye compounds of photoresists of the invention can significantly reduce or even eliminate undesired reflections of exposure radiation, particularly deep U.V. exposure radiation such as 248 nm. Use of the dye compounds also provides significantly enhanced resolution and masking linearity of developed resist images. See, for instance, the results and comparative data disclosed in Example 4 which follows.

It also has been found that dye compounds of the invention function as I-line sensitizer compounds, enabling effective imaging of the resists at higher wavelengths, particularly I-line exposures, whereas the resists are not photoactivated and do not form acceptable relief images in the absence of the dye compound. See, for instance, the results of Example 5 which follows. While not being bound by theory, it is believed the anthracene dye compound can effectively absorb 365 nm radiation, and then transfer that energy in a form effective to activate a deep U.V. photoactive component.

It also has been found that preferred dye compounds of the invention as formulated in a photoresist are surprisingly resistant to undesired sublimation during resist processing conditions. More particularly, it has been found that many anthracene monomers can sublime out of a photoresist coating layer during pre-exposure softbake step, decreasing the anthracene concentration in the resist coating layer in an uncontrolled manner, which can compromise lithographic performance. In contrast, preferred dye compounds of the invention do not significantly sublime during resist processing such as pre-exposure soft-bake and post-exposure bake steps. See, for instance, the results of Example 6 which follow.

It also has been found that preferred dye compounds of the invention, particularly compounds that are reaction products of a phenyl compound such as phenol and an anthracene monomer, exhibit substantially greater absorbance of 248 nm radiation relative to use of a simple anthracene monomer such as 9-anthracenemethanol. See, for instance, the results of Example 6 below. Thus, dye compounds of the invention can be used in relatively low concentrations, which can provide enhanced lithographic results such as less potential occurrence of residues and scumming after development.

As used herein, the term "dye compound", "anthracene dye compound" or other similar term refers to the compound whether it functions to reduce undesired reflections of exposure radiation, or to sensitize a resist to higher wavelength exposure wavelengths such as 365 nm.

Preferred dye compounds of resist compositions of the invention are non-polymeric molecules that have a molecular weight about less than 1,500 or 1,000 daltons, more preferably a molecular weight of less than about 800 or 500 daltons. Generally preferred dye compounds include those that are a reaction product of an optionally substituted anthracene compound (e.g. haloalkylanthracene, alkanolanthracene or other reactive anthracene compound) and another optionally substituted aromatic compound such as an optionally substituted phenolic compound. Even more preferred are such anthracene dye compounds that have one or more hydroxyl groups, preferably 1 to about 3 hydroxyl groups that can facilitate formation of a homogenous photoresist solution.

The invention further provides methods for forming photoresist relief images and novel articles of manufacture comprising substrates such as a microelectronic wafer or a flat panel display substrate coated with photoresist composition of the invention. Other aspects of the invention are disclosed infra.

DETAILED DESCRIPTION OF THE INVENTION

As discussed above, dye compounds of photoresists of the invention include at least one anthracene group. Preferred dyes include at least one additional aromatic group, such as compounds of the following Formula (I):

wherein R is an optionally substituted aromatic group, including heteroaromatic or carbocyclic aryl, although optionally substituted carbocyclic aryl is generally more preferred such as optionally substituted phenyl, naphthyl, phenanthryl, acenaphthyl, etc.;

each W is a linker and may be the same or different such as a chemical bond; optionally substituted alkylene, preferably $C_{1-12}$ alkylene, more preferably $C_{1-6}$ alkylene; optionally substituted alkenylene, preferably $C_{2-12}$ alkenylene, more preferably $C_{2-6}$ alkenylene; optionally substituted alkynylene, preferably $C_{2-12}$ alkynylene, more preferably $C_{2-6}$ alkynylene; optionally substituted heteroalkylene, preferably $C_{1-12}$ heteroalkylene, more preferably $C_{1-6}$ alkylene; optionally substituted heteroalkenylene, preferably $C_{2-12}$ heteroalkenylene, more preferably $C_{2-6}$ heteroalkenylene; or optionally substituted heteroalkynylene, preferably $C_{2-12}$ heteroalkynylene, more preferably $C_{2-6}$ heteroalkynylene;

each Anthracene is the same or different optionally substituted anthracene group; and n is an integer suitably 1 to about 6 or more (where the R aromatic group has more than 6 positions available for substitution), and more preferably n is 1, 2 or 3.

Particularly preferred compounds of Formula (I) include those with an R group that is optionally substituted phenyl, such as compounds of the following Formula II:

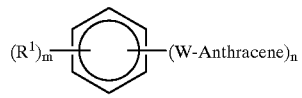

wherein W and Anthracene are the same as defined above for Formula I; each $R^1$ is independently hydroxy, halogen (F, Cl, Br or I), nitro, cyano, optionally substituted alkyl such as $C_{1-12}$ alkyl, optionally substituted alkoxy such as $C_{1-12}$, optionally substituted carbocyclic aryl, optionally substituted aryalkyl such as benzyl and the like, or optionally substituted heteroaromatic or heteroalicyclic having from 1–3 separate or fused rings, 3 to about 8 atoms in each ring and 1 to about 3 N, O or S atoms; and m is an integer equal to 0 (where no $R^1$ groups are present) to 5, n is an integer equal to 1 (i.e. a single Anthracene group substitution) to 6; and preferably n is 1, 2 or 3, and the sum of n and m does not exceed 6. It is also of course understood that the above-depicted phenyl group has a hydrogen substituent in those rings positions that are not substituted by an $R^1$ or an Anthracene group.

Further preferred dyes of the invention include multiple aromatic groups in addition to an anthracene group, such as compounds of the following Formula (III):

wherein each R is independently an optionally substituted aromatic group, including heteroaromatic or carbocyclic aryl, although optionally substituted carbocyclic aryl is generally more preferred such as optionally substituted phenyl, naphthyl, phenanthryl, acenaphthyl, etc.;

each W and each Anthracene are the same or different and as defined above in Formula I;

p is an integer equal to 2 to about 5, more preferably 2 to about 3, and still more preferably p is 2; and n is an integer suitably equal to 1 to about 6 or more, and more preferably n is 1, 2 or 3. Compounds of Formula III suitably may have multiple R group substitution to a W linker, such as a methylene or other alkylene W group, or an anthracene group may be suitably substituted by multiple anthracene groups, or both anthracene and W linker groups may be substituted by R groups.

As with Formula I, particularly preferred compounds of Formula (III) include those with R groups that are optionally substituted phenyl, such as compounds of the following Formula (IV):

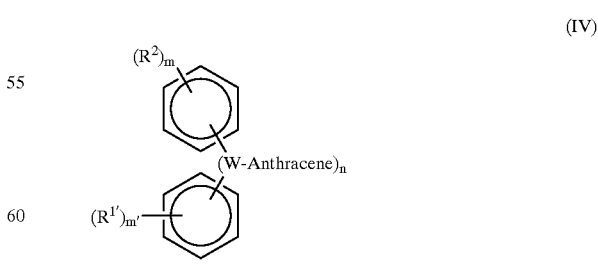

wherein W and Anthracene are the same as defined above for Formula I; each $R^1$ and each $R^{1'}$ is independently hydroxy, halogen (F, Cl, Br or I), nitro, cyano, optionally substituted alkyl such as $C_{1-12}$ alkyl optionally substituted alkoxy such as $C_{1-12}$, optionally substituted carbocyclic aryl, optionally substituted aryalkyl such as benzyl and the like, or optionally substituted heteroaromatic or heteroalicyclic having from 1–3 separate or fused rings, 3 to about 8 atoms in each ring and 1 to about 3 N, O or S atoms; and m and m' are each independently an integer equal to 0 (where no $R^1$ or $R^{1'}$ groups are present) to 5. It is also of course understood that the above-depicted phenyl group has a hydrogen substituent in those rings positions that are not substituted by an $R^1$ or an Anthracene group.

Generally preferred compounds of the above formulae have 1, 2 or 3 Anthracene groups, i.e. n is 1, 2 or 3, and more preferred are compounds that have one or two Anthracene groups, i.e. where n is 1 or 2.

In the above formulae, the Anthracene group(s) preferably links with the W linker at the 9-anthracene position such as specific dye compounds disclosed below, although linkages at other anthracene ring positions also are suitable.

Preferred W groups of the above formulae include $C_{1-3}$alkylene, particularly methylene.

As discussed above, W groups may contain one or more carbon-carbon double or triple bonds, i.e. alkenylene, alkynylene, heteroalkenylene or heteroalkynylene linkage. Such unsaturated W groups typically contain 1, 2, 3 or 4 carbon-carbon multiple bonds, more typically 1 or 2 carbon-carbon multiple bonds. A W group that is heteroalkylene, heteroalkenylene or heteroalkynylene contains one or more N, O or S atoms in the chain between the R and Anthracene groups. Typically a heteroalkylene, heteroalkenylene or heteroalkynylene W groups contains 1–3 N, O or S atoms in the chain, more typically 1 or 2 N, O or S atoms in the chain.

Suitable heteroaromatic groups of compounds of the above formulae suitably contain one or more N, O or S atoms and include e.g. coumarinyl including 8-coumarinyl, quinolinyl including 8-quinolinyl, pyridyl, pyrazinyl, pyrimidyl, furyl, pyrrolyl, thienyl, thiazolyl, oxazolyl, imidazolyl, indolyl, benzofuranyl, benzothiazol and the like. Suitable heteroalicyclic groups of compounds of the above formulae suitably contain one or more N, O or S atoms and include e.g. tetrahydrofuranyl, tetrahydropyranyl and morpholino.

Alkyl groups of dye compounds of the above formulae may be cyclic or non-cyclic, although of course cycloalkyl groups will contain at least 3 carbon ring members.

The above-mentioned optionally substituted groups of the above formulae (including substituted groups R, $R^1$, $R^{1'}$, W and Anthracene groups) may be substituted at one or more available positions by one or more suitable groups such as e.g. halogen (particularly F, Cl and Br); cyano; hydroxyl, nitro, alkanoyl such as a $C_{1-6}$ alkanoyl group such as acyl and the like; alkyl groups having from 1 to about 8 carbon atoms; alkenyl and alkynyl groups having one or more unsaturated linkages and 2 to about 8 carbon atoms; alkoxy groups having from 1 to about 6 carbons; alkylthio such as $C_{1-6}$alkylthio, etc.

As discussed above, preferred dye compounds are relatively small non-polymeric molecules and preferably have a molecular weight of about 2,000 daltons or less, more preferably about 1,500 or 1,000 daltons or less, still more preferably about 800 daltons or less, about 700 daltons or less, about 600 daltons or less, about 500 daltons or less, or about 400 daltons or less. Typically preferred dye compounds have a molecular weight of at least about 200 daltons, more typically a molecular weight of at least about 220, 230, 240, 250, 260, 270, 300, 325 or 350 daltons.

Dye compounds for use in the photoresists of the invention preferably exhibit good absorbance at deep UV wavelengths such as within the range of from 100 to about 300 nm. More specifically, preferred dye compounds have optical densities of at least about 3 absorbance units per micron (Absorb. units/μ) at about 248 nm, preferably from about 5 to 20 or more absorbance units per micron at 248 nm, more preferably from about 8 to 20 or more absorbance units per micron at 248 nm. Higher absorbance values for a particular dye compound can be obtained by increasing the absorbing units on a dye compound, particularly the number of anthracene or other aromatic groups. As referred to herein, optical density of a dye compound is determined by the following procedure: spin cast a solution of the dye compound onto a polished quartz wafer (e.g. 4 inch wafer). Wafers are soft baked for 60 seconds at approximately 110° C. Coating layer thickness are determined using a Prometrix SM300 Thickness Measurement tool. Absorbance spectral curves are generated for the coating layers, e.g. using a Cary 13 UV-VIS Spectrophotometer. Absorbances are normalized for a 1.0 μm thick film.

Specifically preferred dye compounds of the invention include the following Dye Compounds 1 through 34 (labeled as 1 through 34 respectively below). In Compounds 7– 34, the designation "A" refers to an unsubstituted 9-anthracene group.

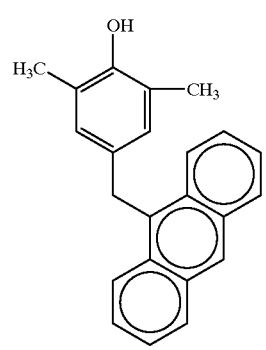

1

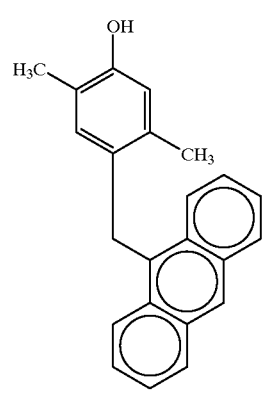

2

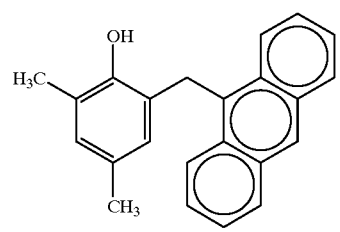

3

-continued
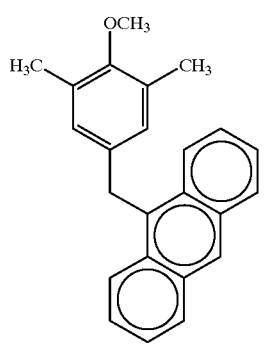
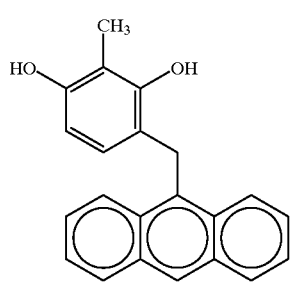
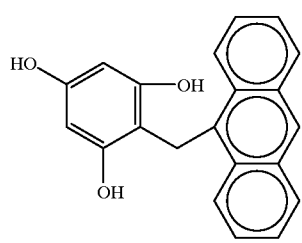
7
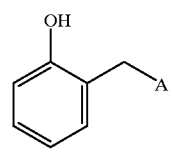
8
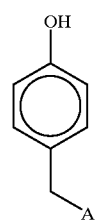
9
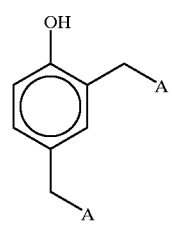
-continued
4
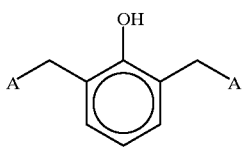
5
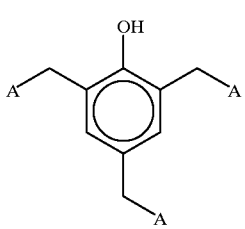
6
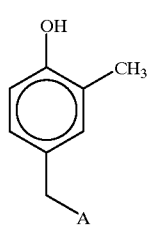
7
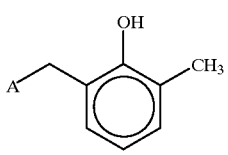

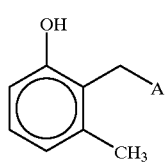
17
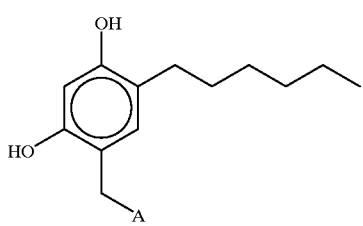
24
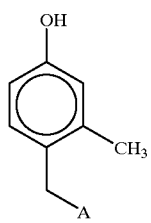
18
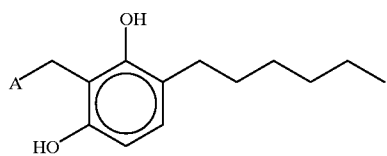
25
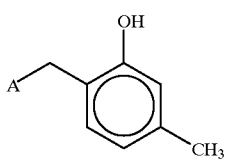
19
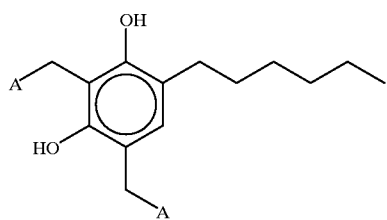
26
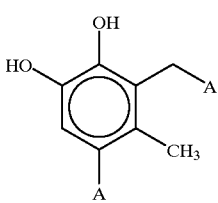
20
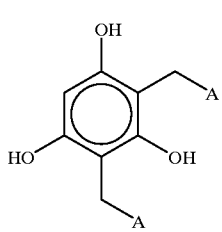
27
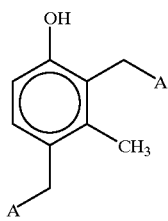
21
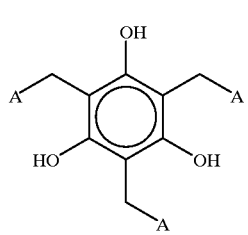
28
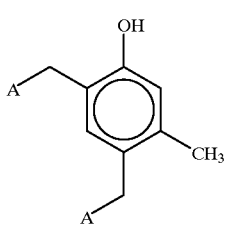
22
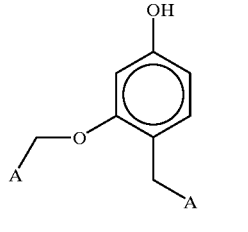
29
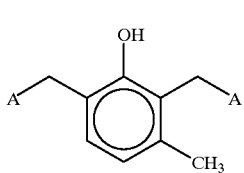
23
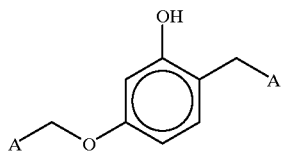
30

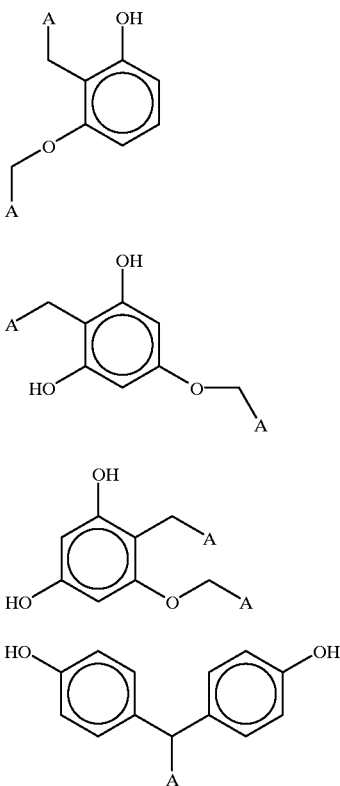

Dyes of the invention can be prepared by known synthetic methods. As discussed above, preferred dye compounds include those that are a reaction product of an optionally substituted anthracene compound and another optionally substituted aromatic compound. More specifically, dyes of the invention can be prepared by acid-promoted reaction of a reactive anthracene compound such as a haloalkylanthracene compound or a alkanolanthracene compound with an optionally substituted aromatic compound such as one or more phenolic compounds. A suitable reaction solvent is preferably used, e.g. an alcohol such as ethanol, and the reaction mixture heated. The formed dye compound can be further reacted if desired to provide additional substituents. See, for instance, Examples 1–3 which follow for exemplary synthetic procedures.

The concentration of a dye compound within a photoresist composition may vary within relatively broad ranges, and in general a dye compound is employed in a concentration of from about 1 to 20 weight percent of the total of the dry components of a photoresist, more typically from about 2 to 10 weight percent of the total dry components (all resist components except solvent carrier). As discussed above, it has been found that relatively low concentrations of a dye compound of the invention in a photoresist can effectively reduce unwanted reflections of 248 nm exposure radiation.

As discussed above, in addition to a dye compound, photoresists of the invention contain resin binder and photoactive components. Negative resists of the invention also include a crosslinking component. The photoactive component may suitably be either a photoacid or a photobase generator, although photoacid generators may be more typically employed, particularly for positive-acting resists.

Preferably the photoresist resin binder has functional groups that impart alkaline aqueous developability to the photoimaged resist composition. Preferred are resin binders that comprise polar functional groups such as hydroxyl or carboxylate and the resin binder is used in a resist composition in an amount sufficient to render the resist developable with an aqueous alkaline solution.

Generally preferred resist resin binders are phenolic resins including phenol aldehyde condensates known in the art as novolak resins, homo and copolymers or alkenyl phenols and homo and copolymers of N-hydroxyphenyl-maleimides.

Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight (Mw) from about 500 to 100,000 daltons. Novolak resins are particularly suitable for photoresists of the invention that are to be imaged with I-line radiation.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols also may be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred poly (vinylphenol) resins prepared from such vinylphenols have a molecular weight (Mw) range of from about 2,000 to about 60,000 daltons. See also U.S. Pat. Nos. 4,439,516 and 5,128,230 for poly(vinylphenol) syntheses.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al. Such copolymers are particularly suitable for deep U.V. imaging (especially ca. 248 nm) because of the increased transparency imparted by the cyclic alcohol units of those copolymers.

Resins formed from bishydroxymethylated compounds and block novolak resins also will be suitable resin binders. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

In preferred aspects, the invention provides chemically amplified positive-acting resist compositions that contain a resin dye as discussed above. A number of such resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. Particularly preferred chemically amplified photoresists of the invention comprise in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One preferred copolymer binder has repeating units x and y of the following formula:

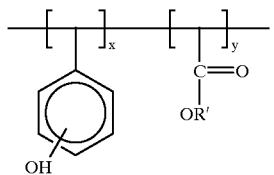

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less.

Another preferred group of copolymers for use as a resin binder for a chemically-amplified positive-acting resist contains acid labile groups on both phenolic and non-phenolic units of the copolymer. One preferred copolymer binder has repeating units x, y and z of the following formula:

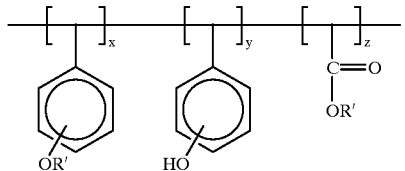

wherein each R' group is the same or different acid labile group as defined above for the other preferred copolymer; and x, y and z are copolymer units and may be regularly alternating in the copolymer, or may be randomly interspersed through the polymer. Such copolymers may be formed in the same manner as described for the copolymer above, and wherein the formed copolymer is reacted to provide the phenolic acid labile groups.

Additional preferred chemically-amplified positive resists are disclosed in U.S. Pat. No. 5,258,257 to Sinta et al.

Preferred negative-acting resist compositions of the invention comprise a dye compound as discussed above and a mixture of materials that will cure, crosslink or harden upon exposure to acid.

Particularly preferred negative-acting resist compositions comprise an anthracene dye compound of the invention, a resin binder such as a phenolic resin, a crosslinker component and a photoacid generator. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly (vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

The invention also includes "conventional" positive-acting resists that comprise a dye compound as discussed above, a photoacid generator that serves as a dissolution rate inhibitor and a resin binder component such as a novolak or poly(vinylphenol) or partially hydrogenated derivative thereof Photoactivation of a coating layer of the resist results in conversion of the photoactive component to an acidic material, rendering regions of the coating layer containing this acidic photoproduct comparatively more soluble in an aqueous alkaline developer solution than regions that contain only the intact (non-activated) photoactive component.

A wide variety of materials may be employed as a photoactive component of photoresists of the invention. As discussed above, photoacid generators, or "PAGs" are generally preferred.

Sulfonate compounds are generally preferred PAGs, particularly sulfonate salts. Two specifically preferred agents are the following PAGS 1 and 2:

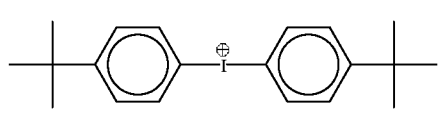

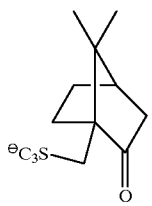

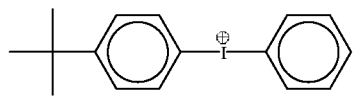

-continued

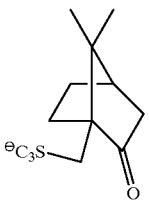

Such sulfonate compound can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then (±)-10-camphorsulfonic acid followed by neutralization with ammonium hydroxide. Sulfonate PAG 2 above can be prepared by the same procedures as disclosed in the European Application 96118111.2, except approximately molar equivalents of t-butyl benzene and benzene would be reacted together in the first step with acetic anhydride and $KIO_3$. Also preferred are the above two iodonium compounds with counter anions of trifluoromethylsulfonate ($CF_3SO_3$) and benzenesulfonate. These sulfonate PAGS are particularly preferred for use in the chemically-amplified positive photoresists of the invention, and are effectively imaged at 248 nm (with or without the anthracene dye compound) as well as 365 nm in the presence of the anthracene dye compound of the invention.

Also suitable are the above two iodonium compounds complexed with counter anions other than the above-depicted camphorsulfonate groups. In particular, preferred counter anions include those of the formula $RSO_3^-$ where R is, alkyl (e.g. $C_{1-12}$ alkyl) adamantane and other cycloalkyl typically having from 5 to about 12 ring members, and perfluoroalkyl such as perfluoro ($C_{1-12}$alkyl), particularly perfluoro counter anions of perfluorooctanesulfonate, perfluorononylsulfonate and the like.

Triphenylsulfonium salts are also suitable PAGS for use in the photoresists of the invention, including compounds of the following formula:

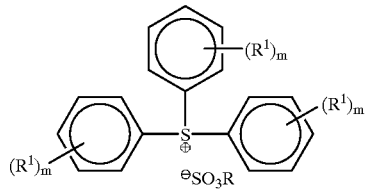

wherein each $R^1$ is independently hydrogen, $C_{1-12}$ alkyl or $C_{1-12}$ alkoxy; each m is independently an integer of from 0 to 5, and preferably each m is 0, 1 or 2 ; and R is as defined above, i.e. alkyl (e.g. $C_{1-12}$ alkyl), camphor, adamantane and other cycloalkyl typically having from 5 to about 12 ring members, and perfluoroalkyl such as perfluoro($C_{1-12}$alkyl), particularly perfluoro counter anions of perfluorooctanesulfonate, perfluorononylsulfonate and the like.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl α-(p-toluenesulfonyloxy)-acetate and t-butyl α-(p-toluenesulfonyloxy)-acetate. Preferred sulfonate PAGs are also disclosed in U.S. Pat. No. 5,344,742 to Sinta et al.

Preferred PAGS also include imidosulfonates such as compounds of the following formula:

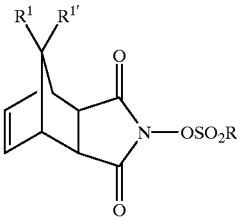

wherein each $R^1$ and $R^{1'}$ are each independently hydrogen or $C_{1-12}$ alkyl more preferably hydrogen or methyl; and R is as defined above, i.e. alkyl (e.g. $C_{1-12}$ alkyl), camphor, adamantane and other cycloalkyl typically having from 5 to about 12 ring members, and perfluoroalkyl such as perfluoro ($C_{1-12}$alkyl), particularly perfluoro counter anions of perfluorooctanesulfonate, perfluorononylsulfonate and the like. A specifically preferred PAG is N-[(perfluorooctane sulfonyl)oxy]-5-norbornene-2,3-dicarboximide.

Onium salts also can be employed as photoacid generators of resist compositions of the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other suitable photoacid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds are also suitable such as, for example, 1,1-bis[p-chlorophenyl]-2,2,2-trichloroethane DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl)benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris (trichloromethyl)triazine.

As discussed above, the invention also provides photoresist compositions that include a photobase generator compound, particularly negative base-hardening compositions that contain a dye material of the invention, a resin binder such as the above-discussed phenolic resins, a crosslinker and a photobase generator compound that undergoes a base-promoted crosslinking reaction upon exposure to activating radiation. Suitable photobase generator compounds and the use of base-hardening composition are disclosed in U.S. Pat. No. 5,262,280 to Knudsen et al. Amine-based crosslinkers such as the above-discussed melamine resins are suitable for base-hardening compositions.

Photoresists of the invention also may contain other materials. A preferred optional additive is an added base, particularly tetrabutylammonium hydroxide (TBAH), or lactate salt of TBAH, which can enhance resolution of a developed resist relief image. The added base is suitably used in relatively small amounts, e.g. about 1 to 20 percent by weight relative to the photoactive component.

Other optional additives include anti-striation agents, plasticizers, speed enhancers, etc. Dye compounds in addition to the above-discussed resin materials also may be employed if desired. Such optional additives typically will be present in minor concentration in a photoresist composition except for fillers and additional dyes which may be present in relatively large concentrations such as, e.g., in amounts of from 5 to 30 percent by weight of the total weight of a resist's dry components.

The photoresist compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether acetate, propylene glycol monomethyl ether; a Cellosolve ester or a ketone such as methyl ethyl ketone. Typically, the solids content of the composition varies between about 5 and 35 percent by weight of the total weight of the photoresist composition. The resin binder and the photoactive components should be present in amounts sufficient to provide a film coating layer and formation of good quality latent and relief images. See the examples which follow for exemplary preferred amounts of resist components.

The photoresist compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 $mJ/cm^2$, dependent upon the exposure tool and the components of the photoresist composition.

Coating layers of the resist compositions of the invention are suitably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Coating layers of the resist compositions of the invention also may be imaged at longer wavelengths, particularly with I-line exposures (ca. 365 nm) as discussed above.

Following exposure, the film layer of the composition is preferably baked at temperatures ranging from about 50° C. to about 160° C. to create or enhance solubility differences between exposed and unexposed regions of a coating layer. For example, negative photoresists typically require post-exposure heating to induce an acid-promoted or base-promoted crosslinking reaction, and many chemically amplified positive-acting resists require post-exposure heating to induce an acid-promoted deprotection reaction.

After any such post-exposure bake, the film is developed, preferably using an aqueous-based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

All documents mentioned herein are incorporated herein in their entirety by reference. The following non-limiting examples are illustrative of the invention.

EXAMPLES 1–3

Preparation of Preferred Dyes

EXAMPLE 1

Preparation of Dye 1 via alkylation of 2,6-Dimethylphenol with 9-(chloromethyl)anthacene Into an oven-dried 250 ml round-bottomed flask were placed anhydrous zinc chloride (0.01 g), 9-(chloromethyl) anthracene (2.27 g, 10 mmol), 2,6-dimethylphenol (6.15 g, 50 mmol) and CHCl₃ (50 mL). After stirring ¾ hour, the reaction mixture was diluted with CHCl₃ (250 mL) and washed with 1N HCl (1×200 mL), 1N NaOH (2×200 mL), brine (1×200 mL), and dried over sodium sulfate. The filtered solution was concentrated to afford a tan solid which was recrystallized from $CH_2Cl_2$ (30 mL) and hexane (470 mL). A second recrystallization from benzene/hexane afforded the desired product as colorless needles (2.45 g, 78%) after drying at 60° C. for 18 hours under high vac. mp 166–167° C.; MS m/z (M+) 312; Anal. Calculated for $C_{23}H_{20}O$: C, 88.42; H, 6.45. Found: C, 88.12; H, 6.27. $^1$H NMR (CDCl₃) ppm 8.40 (s, 1H), 8.20 (d, 2H, J=8 Hz), 7.97 (d, 2H, J=8 Hz), 7.45–7.35 (m, 4H), 6.72 (s, 2H), 4.85 (s, 2H), 4.43 (s, 1H, —OH, vis D₂O exchange), 2.05 (s, 6H). $^{13}$C NMR(CDCl₃) ppm 150.49, 132.47, 131.81, 130.68, 129.22, 128.27, 126.49, 125.94, 125.10, 125.04, 123.11, 32.88, 16.06.

EXAMPLE 2

Preparation of Dye 6 by alkylation of phloroglucinol with 9-anthracenemethanol Into an oven-dried 500 mL round-bottomed flask were placed p-toluenesulfonic acid (0.05 g), 9-anthracenemethanol (8.33 g, 40 mmol), phloroglucinol (50 g, 400 mmol) and denatured ethanol (250 mL). After refluxing for 18.5 hours, the reaction mixture was cooled and concentrated. The residue was redissolved in ethyl acetate (600 mL) which was then washed with water (15× 200 mL) and dried over sodium sulfate. The filtered solution was concentrated to afford a dark solid which was triturated with toluene (400 mL). Flash chromatography of the solid (500 g silica gel, 40% ethyl acetate/hexane) provided an off-white powder. Recrystallization from ethyl acetate/toluene afforded fibrous needles (3.55 g, 28%) after drying at 50° C. for 18 hours under high vac. mp 233–236° C.; MS m/z (M+) 316. $^1$H NMR (acetone-D₆) ppm 8.81 (m, 2H), 8.33 (s, 1H, 8.22 (bs, 2/3H, —OH), 8.03 (bs, 1/3H, —OH), 7.93 (m, 2H), 7.40 (m, 4H), 5.96 (2, 2H), 4.92 (s, 2H), 3.36 (bs, 2H, —OH). $^{13}$C NMR (acetone-D₆) ppm 157.01, 156.91, 156.54, 135.62, 131.76, 130.83, 127.72, 126.46, 125.39, 124.52, 124.42, 106.74, 94.76, 22.13.

EXAMPLE 3

Preparation of Dye 4 by methylation of phenol (1) with methyl iodide

Into an oven-dried 250 mL round-bottomed flask were placed phenol 1 (3.5 g, 11.2 mmol), anhydrous potassium carbonate (10 g, 72 mmol), methyl iodide (22.6 g, 100 mmol), and anhydrous N,N-dimethylformamide (40 mL). After stirring 41 hours, the reaction mixture was poured into water (250 mL) and extracted with iso-octane (3×200 mL). The combined iso-octane extracts were washed with 1N HCl (2×200 mL), saturated aqueous sodium bicarbonate (1×200 mL), brine (1×200 mL), and dried over sodium sulfate. The filtered solution was concentrated to afford a golden oil. Iso-octane (100 mL) was added to the crude product, and the resulting solid was collected by filtration. Flash chromatography of the concentrated filtrate (200 g silica gel, cyclohexane to 4% ethyl acetate/cyclohexane) provided an orange oil which was treated with refluxing methanol (100 mL) and filtered. The filtrate was cooled to −78° C. and the yellow solid which precipitated was filtered off. The filtrate was further cooled at −78° C. and the powder which precipitated was collected by filtration to afford a colorless powder (2.1 g, 58%) after drying at 50° C. for 14 hours under high vac. mp 106–107° C.; MS m/z (M+) 326; Anal. Calculated for $C_{24}H_{22}O$: C, 88.31; H, 6.79. Found: C, 88.24; H, 6.76. $^1$H NMR (CDCl₃) ppm 8.63 (s, 1H), 8.22 (m, 2H), 8.05 (m, 2H), 7.45 (m, 4H), 6.75 (s, 2H), 4.85 (s, 2H), 4.85 (s, 2H), 3.63 (s, 3H), 2.07 (s, 6H). $^{13}$C NMR (CDCl₃) ppm 155.34, 136.27, 132.42, 131.88, 140.89, 130.76, 129.29, 128.56, 126.64, 126.01, 125.14, 125.09, 59.76, 33.17, 16.31.

EXAMPLE 4

Photoresist preparation and lithographic processing at 248 nm

A photoresist composition (referred to below as "Resist 1") was prepared by admixing the following components in the following amounts: 13.170 g of polyhydroxystyrene-t-butylacrylate copolymer solids, 0.527 g of di-t-butylphenyliodium camphorsulfonate photoacid generator, 0.033 g of tetrabutyl ammonium hydroxide lactate solution, 0.270 g of 4-anthracene-1,3-dimethylphenol (Dye 1), 0.70 g Silwet™L-7604 surfactant, and 85.929 g ethyl lactate. The polyhydroxystyrene-t-butylacrylate copolymer had a Mw of about 20,000 and was obtained from Maruzen Oil Company of Tokyo, Japan under the tradename of Maruzen CTBA 161. Silwet™L-7604 was obtained from Union Carbide.

Four inch silicon wafers were vapor-primed with HMDS and coated with Resist 1 to 0.86 μm film thickness. Coated wafers were softbaked for 60 seconds at 140° C. with a vacuum hot plate. The coated wafers were then exposed on a GCA XLS 7800 excimer laser stepper at 248 nm, and the exposed wafers were post-expose baked for 90 seconds at 140° C. and developed with 20/25 second double-spray puddle with 0.26N tetramethylammonium hydroxide developer.

The following lithographic results were achieved with Resist 1: $E_o$ dose (mJ/cm²): 2.6; $E_{size}$ dose (mJ/cm²): 7.2; $E_o/E_{size}$ ratio: 2.8; % UFTL: 1.5; ultimate resolution: 0.210 microns.

A comparative photoresist (Comparative Photoresist 1) was prepared that had the same components and component amounts as specified above for Resist 1, except that a methylanthracene methacrylate/hydroxyethyl methacrylate ("ANTMA/HEMA") copolymer was used in place of Dye 1. The ANTMA/HEMA copolymer had 81 mole percent of —CH₂C(CH₃)₃(CO₂CH₂CH₂OH)— units and 19 mole percent of —CH₂C(CH₃)(CO₂CH₂-9-anthracene) units, a Mn of 2295, Mw of 19150 and a Tg of 101° C. Comparative Resist 1 was coated, softbaked, exposed, post-exposure baked and developed by the same procedures and conditions as described above for Resist 1.

The following lithographic results were achieved with Comparative Resist 1: $E_o$ dose (mJ/cm²): 5.2; $E_{size}$ dose (mJ/cm²): 11.4; $E_o/E_{size}$ ratio: 2.20; % UFTL: 1.56; ultimate resolution: 0.200 microns.

Additional comparative resists that had the same components of Resist 1, but did not contain Dye 1, or any other dye component. The non-dyed resists showed inferior resolution, masking capabilities, depth-of-focus and exposure latitudes relative to Resist 1. Required energy to clear the resist (i.e. $E_o$ mJ/cm²) also as significantly lower for Resist 1 compared to the comparative non-dyed resists.

In this Example, the energy to clear bulk pads of resist material from the wafers [$E_o$] was measured by exposing open blocks of photoresist to increasing energy doses in a stepwise pattern with 1 mJ/cm² increments. The energy dose required to size 0.35 μm line/space patterns [$E_s$] was determined by SEM analysis. Ultimate resolution was determined for the cross-sectional SEM pictures as the smallest feature that resolved at the $E_s$ dose for 0.35 μm line/space patterns.

EXAMPLE 5

Photoresist preparation and lithographic processing at 365 nm

A photoresist composition (referred to below as "Resist 2") was prepared by admixing the following components in the following amounts: 16.529 g of polyhydroxystyrene-t-butylacrylate copolymers solids, 0.520 g of di-t-butylphenyliodium camphorsulfonate photoacid generator, 0.827 g of 4-anthracene-1,3-dimethylphenol (Dye 1), 0.033 g of amine sold under tradename of Tektronics 1501, 0.089 g Silwet™ L-7604 surfactant (Union Carbide), and 81.374 g of methyl amyl ketone solvent. The polyhydroxystyrene-t-butylacrylate copolymer had a Mw of about 20,000.

Four inch silicon wafers were vapor-primed with HMDS and coated with Resist 2 to 0.86 μm film thickness. Coated wafers were softbaked for 60 seconds at 130° C. with a vacuum hot plate. The coated wafers were then exposed on a GCA XLS 7500 I-Line Stepper (0.55 NA, 0.54 P.C.) at 365 nm, and the exposed wafers were post-expose baked for 60 seconds at 130° C. and developed with 60 second exposure to single-spray puddle with 0.26N tetramethylammonium hydroxide developer to provide a well-resolved relief image.

A comparative photoresist (Comparative Photoresist 2) was prepared that had the same components and component amounts as specified above for Resist 2, except that Dye 2 was omitted in Resist 2. Comparative Photoresist 2 was then coated onto wafers and further processed as described above for Resist 2, including exposure with 365 nm radiation. No relief image was provided after post-exposure bake and development steps.

EXAMPLE 6

Sublimation and 248 nm absorbance results

A solution containing a phenolic polymer and Dye Compound 2 (structure shown above) was applied to a silicon wafer substrate to provide a film coating layer on that substrate. The film coating layer contained 2 weight percent of Dye Compound 2. The coated substrate was baked at temperatures of 100° C., 125° C. and 150° C. No sublimation of Dye Compound 2 at any of those bake temperatures was observed. At that 2 weight percent loading of Dye Compound 2, the following absorbance values of 248 nm radiation were observed: at 100° C.: 0.650; at 125° C.: 0.671; at 150° C.: 0.673.

As a comparison, a solution containing a phenolic polymer, melamine crosslinker and 9-anthracenemethanol was applied to a silicon wafer substrate to provide a film coating layer on that substrate. The film coating layer contained 20 weight percent of the 9-anthracenemethanol. The coated substrate was baked at varying temperatures, wherein approximately 20% of the 9-anthracenemethanol in the coating layer sublimed at 100° C., and approximately additional 50% of the 9-anthracenemethanol in the coating layer sublimed at 125° C. and 150° C., resulting in an overall 60% loss of the 9-anthracene methanol to sublimation. At that 20 weight percent loading of the 9-anthracenemethanol, the following absorbance values of 248 nm were observed: at 100° C.: 0.871; at 125° C.: 0.698; at 150° C.: 0.353.

The foregoing description of the invention is merely illustrative thereof and it is understood that variations and modifications thereof can be made without departing from the spirit or scope of the invention as set forth in the following claims.

What is claimed is:

1. A photoresist composition comprising a resin binder, a photoactive component and a dye compound that comprises a reaction product of a phenolic compound and an anthracene compound, the dye compound having a molecular weight of between about 230 and 2,000 daltons and wherein the phenolic compound fragment of the dye compound has at least 1 phenolic hydroxyl group.

2. The photoresist composition of claim 1 wherein the dye compound has a molecular weight of less than about 1500 daltons.

3. The photoresist composition of claim 2 wherein the dye compound has a molecular weight of about 400 daltons or less.

4. The photoresist composition of claim 1 wherein the dye compound has a molecular weight of about 1000 daltons or less.

5. The photoresist composition of claim 1 wherein the dye compound has a molecular weight of about 800 daltons or less.

6. The photoresist composition of claim 1 wherein the dye compound has a molecular weight of between about 250 and 400 daltons.

7. The photoresist composition of claim 1 wherein the dye compound is a reaction product of a single phenolic compound and a single anthracene compound.

8. The photoresist composition of claim 1 wherein the dye compound is of the following formula:

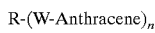

wherein R is an optionally substituted phenolic group;
each W is a linker and may be the same or different;
each Anthracene is the same or different optionally substituted anthracene group; and n is an integer equal to 1 to about 6.

9. The photoresist composition of claim 8 wherein n is 1, 2 or 3.

10. The photoresist composition of claim 1 wherein the dye compound is of the following formula:

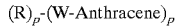

wherein each R is independently an optionally substituted phenolic group;
each W is a linker and may be the same or different;
each Anthracene is the same or different optionally substituted anthracene group;
p is an integer equal to 2 to about 5; and
n is an integer equal to 1 to about 6.

11. The photoresist of claim 1 wherein the dye is a selected from the group consisting of the following compounds:

A is an unsubstituted 9-Anthracene group
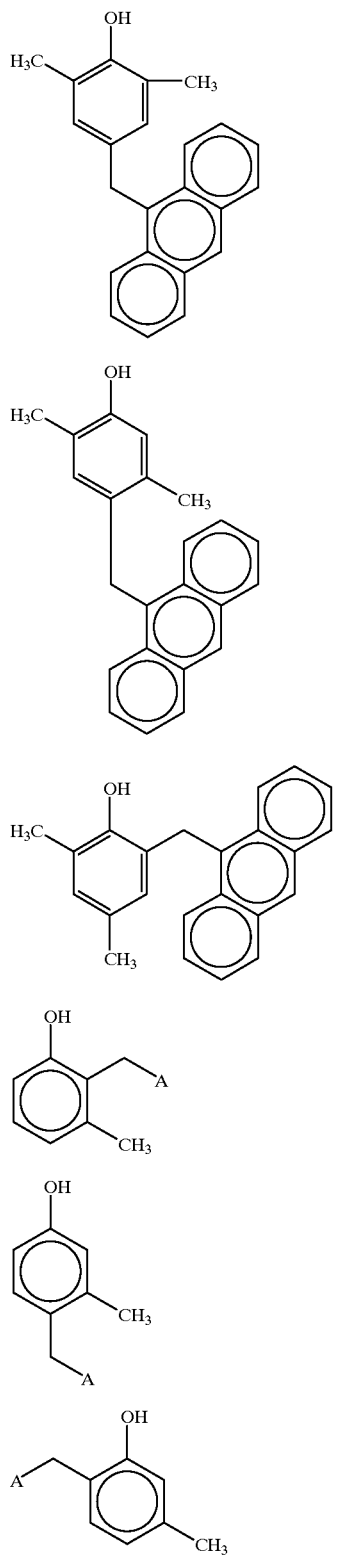
-continued
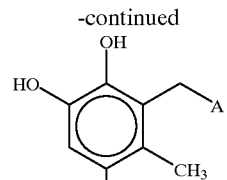
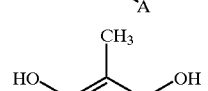
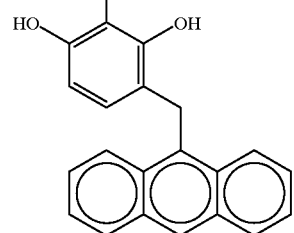
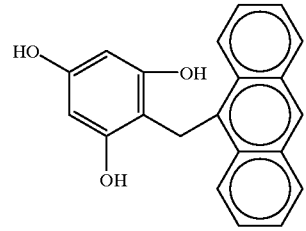
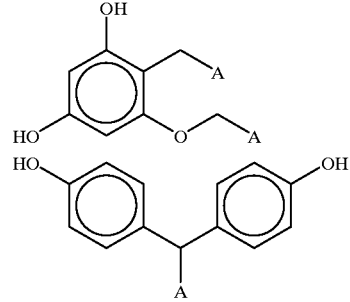
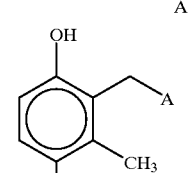
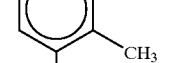
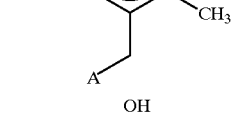
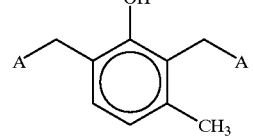

-continued
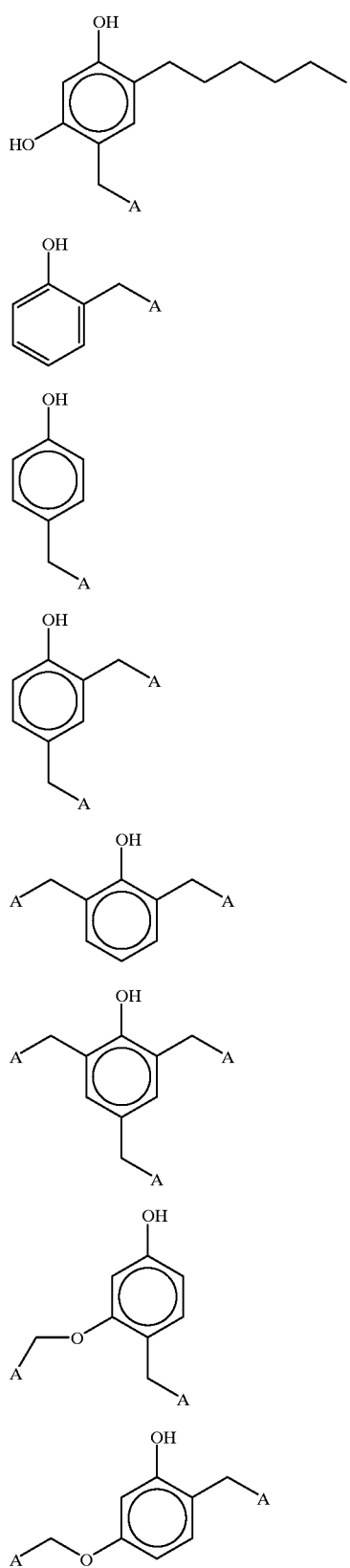
-continued
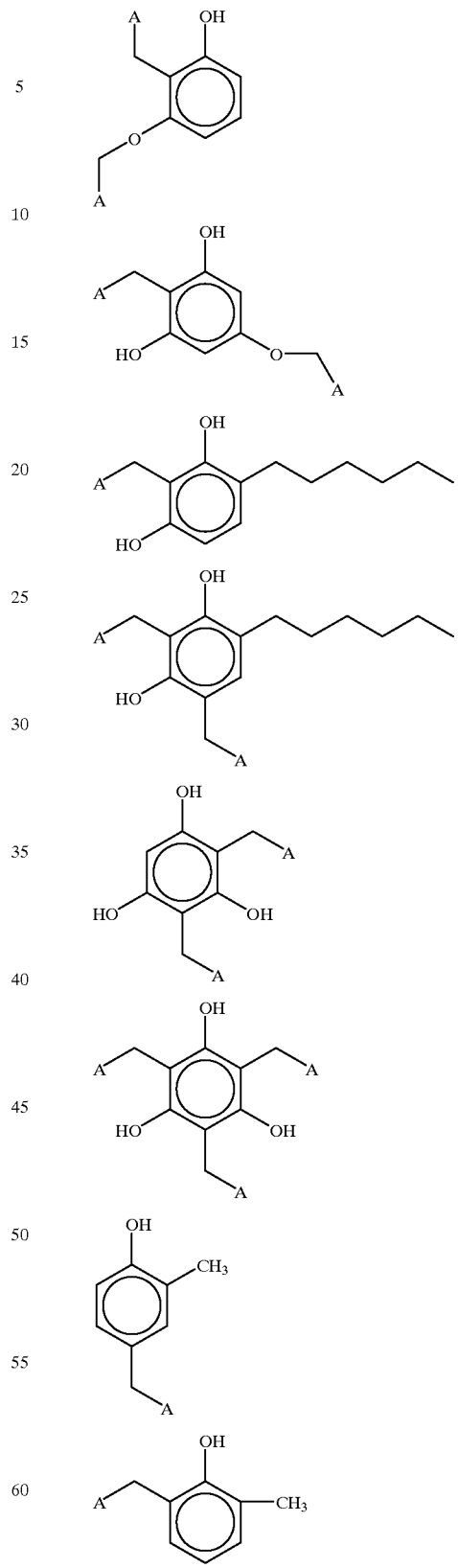

-continued

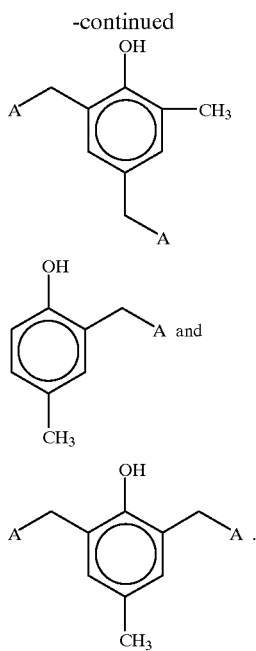

12. The photoresist composition of claim 1 wherein the resist is a positive-acting resist.

13. The photoresist composition of claim 1 wherein the resist is a chemically amplified positive-acting resist.

14. The photoresist composition of claim 1 wherein the photoactive component comprises a photoacid generator that is photoactivated with exposure radiation of a wavelength less than 300 nm.

15. The photoresist composition of claim 1 wherein the photoactive component comprises a photoacid generator that is photoactivated with exposure radiation of a wavelength of 248 nm.

16. The photoresist composition of claim 1 wherein the resist is a negative-acting resist.

17. A method for forming a photoresist relief image comprising:
    (a) applying a coating layer of a photoresist of claim 1 on a substrate;
    (b) exposing the photoresist coating layer on the substrate to patterned radiation to form a latent image in the coating layer;
    (c) developing the exposed photoresist coating layer to provide a photoresist relief image.

18. The method of claim 17 wherein the photoresist coating layer is exposed with radiation having a wavelength of about 248 nm.

19. A method for forming a photoresist relief image comprising:
    (a) applying a coating layer of a photoresist of claim 1 on a substrate;
    (b) exposing the photoresist coating layer on the substrate to patterned radiation having a wavelength of about 365 nm to form a latent image in the coating layer;
    (c) developing the exposed photoresist coating layer to provide a photoresist relief image.

20. The method of claim 19 wherein the photoresist comprises a photoresist acid generator and a dye compound, the photoacid generator being substantially non-reactive to 365 nm radiation in the absence of the dye compound.

21. An article of manufacture comprising a substrate having coated thereon the photoresist composition of claim 1.

22. An article of claim 21 wherein the substrate is a microelectronic wafer substrate or a flat panel display substrate.

23. A photoresist composition comprising a resin binder, a photoactive component and a dye compound having a molecular weight of between about 230 and 2000 daltons and represented by the formula:

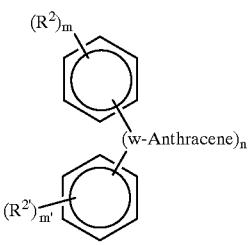

each W is a linker and may be the same or different;

each Anthracene is the same or different optionally substituted anthracene group;

each $R^1$ and each $R^{1'}$ is independently hydroxy, halogen, nitro, cyano, optionally substituted alkyl, optionally substituted alkoxy, optionally substituted carbocyclic aryl, optionally substituted aryalkyl, or optionally substituted heteroaromatic or heteroalicyclic having from 1–3 separate or fused rings, 3 to about 8 atoms in each ring and 1 to about 3 N, O or S atoms;

n is from 1 to about 6; and m and m' are each independently an integer equal to 0 to 5.

24. The photoresist composition of claim 23 wherein the resist is a positive-acting resist.

25. The photoresist composition of claim 23 wherein the resist is a chemically amplified positive-acting resist.

26. The photoresist composition of claim 23 wherein the photoactive component comprises a photoacid generator that is photoactivated with exposure radiation of a wavelength less than 300 nm.

27. The photoresist composition of claim 23 wherein the photoactive component comprises a photoacid generator that is photoactivated with exposure radiation of a wavelength of 248 nm.

28. The photoresist composition of claim 23 wherein the resist is a negative-acting resist.

* * * * *